United States Patent [19]

Nakamura et al.

[11] Patent Number: 5,434,100
[45] Date of Patent: Jul. 18, 1995

[54] SUBSTRATE FOR EPITAXY AND EPITAXY USING THE SUBSTRATE

[75] Inventors: Masashi Nakamura; Shigeo Katsura; Ryuichi Hirano; Nobuhito Makino; Eiji Ikeda, all of Toda, Japan

[73] Assignee: Japan Energy Corporation, Tokyo, Japan

[21] Appl. No.: 51,335

[22] Filed: Apr. 23, 1993

[30] Foreign Application Priority Data

Apr. 23, 1992 [JP] Japan .................. 4-131811

[51] Int. Cl.⁶ ............................. H01L 21/20
[52] U.S. Cl. ..................... 437/105; 137/93; 137/107; 117/84
[58] Field of Search ............ 156/612; 148/DIG. 115; 437/93, 105, 107; 117/84

[56] References Cited

U.S. PATENT DOCUMENTS

| 3,821,783 | 6/1974 | Sugita et al. | 148/DIG. 115 |
| 5,230,768 | 7/1993 | Furukawa et al. | 437/93 |
| 5,248,385 | 9/1993 | Powell | 156/612 |
| 5,279,701 | 1/1994 | Shigeta et al. | 156/612 |

FOREIGN PATENT DOCUMENTS

| 3617927 | 12/1986 | Germany | 437/93 |
| 0042910 | 3/1986 | Japan | 437/93 |
| 2239188 | 9/1990 | Japan . | |
| 2288223 | 2/1991 | Japan . | |

OTHER PUBLICATIONS

Jauslin, H. R., et al., Fabrication of Crystal Surfaces With Low Dislocation Density, Apr. 1982, IBM Technical Disclosure Bulletin, vol. 24, No. 11A, p. 5329.

*Primary Examiner*—R. Bruce Breneman
*Assistant Examiner*—Ramamohan Rao Paladugu
*Attorney, Agent, or Firm*—Birch, Stewart, Kolasch & Birch

[57] ABSTRACT

A substrate wafer for epitaxy of a compound semiconductor single crystal and an epitaxy using the substrate wafer are disclosed. Where the orientation off-angle from the <100> plane of an area available for device formation of a surface of the substrate wafer is $\theta°$, and the growth rate on an epitaxial layer on the substrate wafer is $V$ μm/hr, and the growth temperature of the epitaxial layer is $T$ K, the orientation off-angle $\theta°$ is given by the following expression:

$$0.011\sqrt{V^3} + 6.21 \times 10^{20}/\sqrt{T^{15}} \leq \theta \leq 0.20,$$

where $0.1 \leq V \leq 10$ and $853 \leq T \leq 1023$. The substrate wafer is capable of significantly reducing the number of teardrop-like hillock defects which appear on the surface of the epitaxial layer and of increasing the smoothness of the surface of the epitaxial layer.

10 Claims, 1 Drawing Sheet

SUBSTRATE FOR EPITAXY AND EPITAXY USING THE SUBSTRATE

BACKGROUND OF THE INVENTION

1. Field of the Invention

The present invention relates to a substrate for epitaxy and an epitaxy using the substrate and more particularly to a semiconductor substrate wafer for epitaxy and an epitaxy of a compound semiconductor layer on the compound semiconductor substrate wafer by the metal organic chemical vapor deposition (MOCVD).

2. Description of the Related Art

Conventionally, an epitaxy of a layer of a compound semiconductor single crystal on a substrate wafer of a compound semiconductor single crystal causes the epitaxial layer to experience surface defects (referred to as teardrop-like hillock defect hereinafter) such as ellipsoidal micro protuberances that are arranged in a certain direction across the surface of the layer.

In order to eliminate the defects described above, the present inventors filed a patent application in Japan (see the Japanese unexamined patent application publication HEI.2-239188). This patent publication discloses an epitaxy under conditions that a compound semiconductor substrate wafer for MOCVD epitaxy of which the orientation of the surface is deviated 0.1°–0.5° from the <100> plane is employed and that the temperature of the substrate wafer is 600°–700° C.

The epitaxy disclosed in the Japanese patent publication has an advantage of remarkably reducing the number of teardrop-like hillock defects. After the filing of the Japanese patent application, the present inventors reviewed the epitaxy disclosed in the Japanese patent publication and found another problem. While the epitaxy advantageously reduces the number of teardrop-like defects, an excess of the orientation off-angle of the substrate wafer surface from the <100> plane causes wrinkled defects on the epitaxial layer grown on the substrate wafer surface. The present inventors also found out that an epitaxy using a substrate wafer of which the surface orientation off angle from the <100> plane is lower than 0.1° may provide no teardrop-like hillock defects to the surface of the epitaxial layer grown on the substrate wafer. The present invention was made on the above background.

SUMMARY OF THE INVENTION

A primary object of the present invention is to provide a substrate wafer for epitaxy capable of significantly reducing the number of teardrop-like hillock defects appearing on the surface of an epitaxial layer, grown on the substrate wafer, and of increasing the smoothness of the surface of the epitaxial layer.

In order to achieve this object, a first aspect of the present invention is a substrate wafer for epitaxy of a compound semiconductor single crystal, wherein the orientation off-angle from the <100> plane of the area available for device formation on the surface of the substrate wafer is $\theta°$, the growth rate of the epitaxial layer grown on the surface of the substrate wafer is V µm/hr, and the growth temperature of the epitaxial layer is T K. The orientation off angle $\theta°$ is given by the following expression:

$$0.011\sqrt{V^3} + 6.21 \times 10^{20}/\sqrt{T^{15}} \leq \theta \leq 0.20,$$

where $0.1 \leq V \leq 10$ and $853 \leq T \leq 1023$.

A further object of the present invention is to significantly reduce the number of teardrop-like hillock defects to appear on the surface of an epitaxial layer, grown on a substrate wafer and to increase the smoothness of the surface of the epitaxial layer.

In order to achieve this object, a second aspect of the present invention is a process for growing an epitaxial layer by chemical vapor deposition on a surface of a substrate wafer of a compound semiconductor single crystal, comprising the step of providing the substrate wafer, wherein the orientation off-angle from the <100> plane of an area available for device formation on the surface of the substrate wafer is $\theta°$, and the growth rate of the epitaxial layer grown on the surface of the substrate wafer is V µm/hr, and the growth temperature of the epitaxial layer is T K. The orientation off-angle $\theta°$ is given by the following expression:

$$0.011\sqrt{V^3} + 6.21 \times 10^{20}/\sqrt{T^{15}} \leq \theta \leq 0.20,$$

where $0.1 \leq V \leq 10$ and $853 \leq T \leq 1023$.

The growth rate V preferably is 0.5–1.5 µm/hr and the growth temperature T preferably is 873–973K.

The present inventors repeated an experiment in which an InP epitaxial layer is grown on the surface of an InP substrate wafer which has an orientation off-angle of 0.3° or less from the plane <100>, in order to correct the problem of wrinkled defects and teardrop-like hillock defects which appear on the surface of the epitaxial layer in a conventional vapor deposition.

In view of an in-plane dispersion in the orientation of the substrate wafer surface, the inventors investigated the relation of the orientation of the substrate wafer surface and the density of teardrop-like hillock defects on the epitaxial layer of substrate wafers and points on the surface of each substrate wafer. They found critical orientation off-angles of the substrate wafer surface provide teardrop-like hillock defects, where process parameters are the growth rate V and the growth temperature T of the epitaxial layer. Table 1 shows the critical off-angles.

TABLE 1

| Growth Temperature (°C.) | Growth Rate (µm/hr) | | |
|---|---|---|---|
| | 0.3 | 1.0 | 2.0 |
| 600 | 0.055° | 0.065° | 0.085° |
| 625 | 0.045° | 0.055° | 0.075° |
| 700 | 0.025° | 0.035° | 0.055° |

The present inventors investigated the relation of the orientation off-angle $\theta°$ of the substrate wafer surface, the growth rate V µm/hr and the growth temperature T K of the epitaxial layer and found an empirical relationship described by the formula:

$$\theta = 0.011\sqrt{V^3} + 6.21 \times 10^{20}/\sqrt{T^{15}},$$

where $0.1 \leq V \leq 10$ and $853 \leq T \leq 1023$.

In addition, where the orientation off-angle of the substrate wafer surface was 0.20° or more from the <100> plane, wrinkled defects appeared on the surface of the epitaxial layer and the morphology of the surface of the epitaxial layer degraded.

The present invention was made on the above discovery.

The area available for device formation of the substrate wafer surface is defined as a central portion of the substrate wafer surface, except for an annular peripheral area of the substrate wafer surface, which remains as a dull area and unavailable for device formation. This unavailable area is produced during mirror finishing of the substrate wafer surface and has a radial length of approximately 5 mm from the edge of the substrate wafer toward the center of the substrate wafer surface.

The prior art disclosed in the above Japanese patent publication considers the orientation off-angle of the surface of a predetermined part, e.g., the center of the substrate wafer, as the orientation off-angle of the overall substrate wafer surface. Thus where the orientation off-angle of the surface of any other part of the substrate wafer is less than that of the predetermined part, the surface of that part may experience the creation of teardrop-like hillock defects. The orientation off-angle of the substrate of the prior-art epitaxy is required to be 0.1°–0.5° from the plane <100> so that the prior-art epitaxy can meet the lower limit of the present invention (in a case of the InP substrate wafer, $0.055° \leq \theta$ at a growth temperature of 650° C.) to reduce the number of the teardrop-like hillock defects.

Since the inventive epitaxy employs a substrate wafer having an orientation off-angle from the <100> plane of the overall area available for device formation which is greater or equal to the lower limit given by the inequality, it can remarkably reduce the number of teardrop-like hillock defects on the surface of the epitaxial layer. The inventive epitaxy also can prevent the occurence of wrinkled defects on the epitaxial layer and increase the smoothness of the surface of the epitaxial layer. The prior art wrinkled defects may appear on the surface of the epitaxial layer because the off-angle of the surface of the prior-art substrate wafer equals or exceeds has the upper limit (i.e. 0.20°).

Where the growth rate V is less than 1 μm/hr, the growth time T is prolonged and the amount of spent raw material is increased, so that the production cost of the inventive epitaxial wafers is increased and has poor mass-productivity. On the other hand, where the growth rate V is above 10 μm/hr, the number of surface defects (e.g. protrusions), except teardrop-like hillock defects increases and degrades the morphology of the surface of the epitaxial layer.

Where the growth temperature T is less than 853K, the number of surface defects, except teardrop-like hillock defects, increases and degrades the morphology of the surface of the epitaxial layer. On the other hand, where the growth temperature T is above 1023K, a volatile element (phosphorus) escapes from the substrate wafer to devastate the surface of the substrate wafer.

Thus the growth rate V is selected to be 1–10 μm/hr and the growth temperature T is selected to be 853–1023K.

Other objects, features and advantages of the present invention will be apparent from a consideration of the following description, taken in connection with the accompanying drawing.

DESCRIPTION OF THE PREFERRED EMBODIMENT

Figure 1:
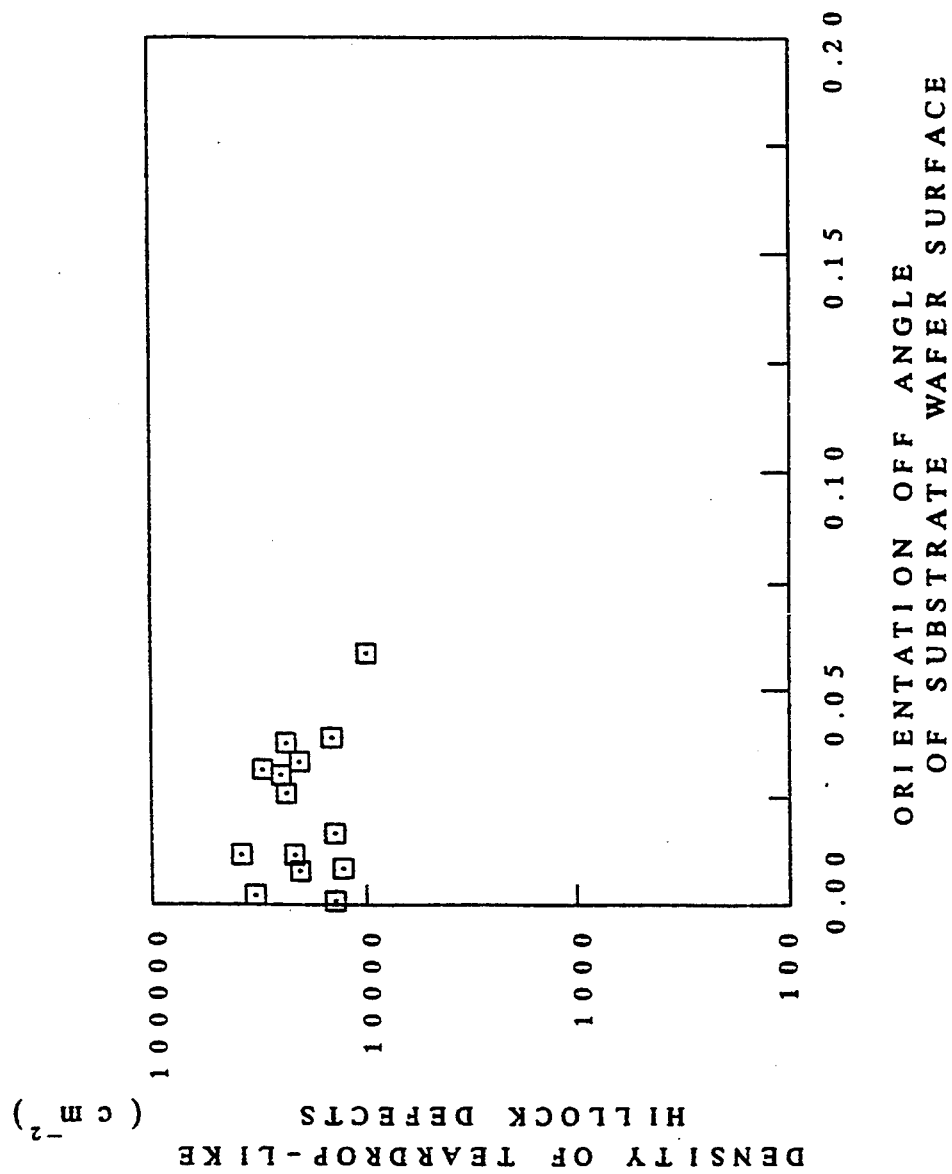
FIG. 1 is a graph illustrative of a relation of off-angles of the orientation of the surface of an InP substrate wafer and the density of teardrop-like hillock defects on the surface of an epitaxial layer grown on the substrate wafer.

A preferred embodiment of the present invention will be described hereinafter. In an example of the present invention, an InP single crystal layer is epitaxially grown on an InP substrate wafer by the MOCVD.

A plurality of InP substrate wafers were conventionally mirror finished to provide InP substrate wafers the surfaces of which have different orientation off-angles from the <100> plane. A MOCVD InP epitaxial layer with a thickness of 3 μm was grown on the surface of each InP substrate wafer under a different growth condition. The orientation off-angle from the <100> plane of the common boundary of an area of the substrate wafer surface having teardrop-like hillock defects and an area having no teardrop-like hillock defects was measured.

The MOCVD epitaxy of the InP layer employed a flow of $1.2 \times 10^{-6}$ mol/min of trimethylindium as a Group III source material and a flow of $1.2 \times 10^{-3}$ mol/min of phosphine (PH$_3$) as a Group V source material and was conducted under a pressure of 76 torr in a growing chamber. The growth rate of the InP epitaxial layer was 1 μm/hr and the growth temperature thereof was 625° C.

The surface of the InP epitaxial layer grown on the surface of each InP substrate wafer was observed using a differential interference microscope. FIG. 1 shows results of the measurement of the density of teardrop-like hillock defects relative to orientation off-angle of the substrate wafer surface. Y-axis of FIG. 1 represents density of teardrop-like hillock defects. X-axis of FIG. 1 represents the orientation off-angle of the substrate wafer surface. FIG. 1 shows the density of teardrop-like hillock defects of only substrate wafers the orientation of the surfaces of which have an in-plane dispersion of ±0.005° or less.

FIG. 1 shows that the density of teardrop-like hillock defects on the surface of the epitaxial layer grown on the InP substrate wafer having the orientation off-angle of less than 0.055° is $5 \times 10^3$-$4 \times 10^4$ cm$^{-2}$. Note that almost no teardrop-like hillock defects appear on the surface of the epitaxial layer grown on the InP substrate wafer where the surface has an orientation off-angle of 0.055°–0.20°.

Table 1 shows critical orientation off-angles of the substrate wafer surfaces at which teardrop-like hillock defects first appear, where the growth rate V and the growth temperature T of the epitaxial layer are process parameters.

In the observation of an epitaxial layer grown on each substrate wafer using the differential interference microscope, the morphology of the surfaces of the substrate wafers having orientation off-angles of more than 0.20° degraded. On the other hand, the morphology of the surfaces of the substrate wafers having orientation off-angles of 0.20° or less was good, so that epitaxial layers on the surfaces of the substrate wafers had no wrinkled defects. In the observation of epitaxial layers grown on each substrate wafer wherein the surface orientations have an in-plane dispersion of ±0.05° or more, part of the surface of the epitaxial layers having a small orientation off-angle had teardrop-like hillock defects.

Table 1 shows the results of the measurement of the density of teardrop-like hillock defects where the growth temperatures, T, are 600° C. and 700° C. and the growth rates, V, are 0.3 μm/hr, 1.0 μm/hr and 2.0 μm/hr. However, possible growth conditions are not restricted to the above growth temperatures and growth rates. The growth temperature, T, may be 853–1023K and preferably is 873–973K. The growth rate, V, may be 0.1–10 μm/hr and preferably is 0.5–1.5 μm/hr.

The above embodiment describes that the InP epitaxial layer is grown on the InP substrate wafer. The present invention also is applicable to a chemical vapor deposition of an epitaxial layer on a substrate of a compound semiconductor such as GaAs. Chloride CVD, hydride CVD and other vapor depositions are applicable to the epitaxy of the layer on the substrate wafer.

The present invention is not rigidly restricted to the embodiments described above. It is to be understood that a person skilled in the art can easily change and modify the present invention without departing from the scope of the invention defined in the appended claims.

What is claimed is:

1. A process for growing an epitaxial layer by a chemical vapor deposition on a surface of a substrate wafer of a compound semiconductor single crystal, comprising the steps of:
   providing the substrate wafer;
   controlling the orientation off-angle, $\theta°$, from the $<100>$ plane of an available area for device formation of the surface of the substrate wafer so that $$0.011\sqrt{V^3} + (6.21 \times 10^{20})/\sqrt{T^{15}} \leq \theta < 0.10$$

controlling the growth rate V μm/hr of an epitaxial layer grown on the substrate wafer so that $0.1 \leq V \leq 10$; and controlling the growth temperature T K of the epitaxial layer so that $853 \leq T \leq 1023$.

2. A process for growing an epitaxial layer by a chemical vapor deposition on a surface of a substrate wafer of a compound semiconductor single crystal, comprising the steps of:
   providing the substrate wafer;
   controlling the orientation off-angle, $\theta°$, from the $<100>$ plane of an available area for device formation of the surface of the substrate wafer so that $$0.011\sqrt{V^3} + (6.21 \times 10^{20})/\sqrt{T^{15}} \leq \theta < 0.05$$

controlling the growth rate V μm/hr of an epitaxial layer grown on the substrate wafer so that $0.1 \leq V \leq 10$; and controlling the growth temperature T K of the epitaxial layer so that $853 \leq T \leq 1023$.

3. The process as claimed in claim 1, wherein the growth temperature T is 873–973K.

4. The process as claimed in claim 1, wherein the growth rate V is 0.5–1.5 μm/hr.

5. The process as claimed in claim 1, wherein the chemical vapor deposition is a metal organic chemical vapor deposition.

6. The process as claimed in claim 1, wherein the compound semiconductor single crystal is indium phosphide.

7. The process as claimed in claim 2, wherein the growth temperature T is 873–973K.

8. The process as claimed in claim 2, wherein the growth rate V is 0.5–1.5 μm/hr.

9. The process as claimed in claim 2, wherein the chemical vapor deposition is a metal organic chemical vapor deposition.

10. The process as claimed in claim 2, wherein the compound semiconductor single crystal is indium phosphide.

* * * * *